United States Patent
Tanahashi (10) Patent No.: US 6,172,305 B1
(45) Date of Patent: Jan. 9, 2001

(54) MULTILAYER CIRCUIT BOARD

(75) Inventor: Shigeo Tanahashi, Kyoto (JP)

(73) Assignee: Kyocera Corporation, Kyoto (JP)

(*) Notice: Under 35 U.S.C. 154(b), the term of this patent shall be extended for 0 days.

(21) Appl. No.: 09/124,346

(22) Filed: Jul. 29, 1998

(30) Foreign Application Priority Data

Jul. 31, 1997 (JP) .................................................. 9-205550

(51) Int. Cl.[7] ..................................................... H04K 1/03
(52) U.S. Cl. ........................ 174/255; 174/225; 174/261; 174/262; 361/794; 361/780; 361/795; 361/792; 361/793; 361/777; 333/246; 333/247; 333/12; 333/32; 333/33; 257/691; 257/728
(58) Field of Search ..................................... 361/794, 780, 361/795, 792–793, 777; 174/25, 261–262; 333/246, 247; 257/691, 728

(56) References Cited

U.S. PATENT DOCUMENTS

| | | | |
|---|---|---|---|
| 4,705,917 | * 11/1987 | Gates, Jr. et al. | 174/52 |
| 5,072,075 | * 12/1991 | Lee et al. | 174/264 |
| 5,519,176 | * 5/1996 | Goodman et al. | 174/255 |

FOREIGN PATENT DOCUMENTS 9018156  1/1997 (JP) .................................. H05K/3/46

OTHER PUBLICATIONS

Low, Yee L., Leonard W. Schaper and Simon S. Ang, "Modeling and Experimental Verification of the Interconnected Mesh Power System (IMPS) MCM Topology," IEEE Feb. 1997, Part B. vol. 20, No. 1, pp. 42–49.

* cited by examiner

Primary Examiner—Jeffrey Gaffin
Assistant Examiner—Thanh Tran
(74) Attorney, Agent, or Firm—Hogan & Hartson, LLP (57) ABSTRACT

First to fourth power wiring conductors and first to fourth ground wiring conductors are arranged on first to fourth insulating layers, respectively, and a first signal wiring conductor is arranged on the first or second insulating layer and a second signal wiring conductor is arranged on the third or fourth insulating layer. In a multilayer circuit board of the invention, the first to fourth insulating layers are sequentially overlaid in the following manner: each of wiring conductors on the same insulating layer is arranged substantially in parallel to each other, each set of the first power wiring conductor and the second ground wiring conductor, the first ground wiring conductor and the second power wiring conductor, the third power wiring conductor and the fourth ground wiring conductor, and the third ground wiring conductor and the fourth power wiring conductor is arranged so that two wiring conductors are opposed to each other nearly in parallel while interposing the insulating layer therebetween, and each wiring on the first and second insulating layers and each wiring on the third and fourth insulating layers intersect at a right angle, and wherein the first to fourth power wiring conductors and the first to fourth ground wiring conductors are connected via thorough conductors disposed through the insulating layers. The inventive multilayer circuit board ensures a uniform characteristic impedance on the signal wiring conductor to enable a stable power supply to a semiconductor device.

11 Claims, 5 Drawing Sheets

MULTILAYER CIRCUIT BOARD

BACKGROUND OF THE INVENTION

1. Field of the Invention

The invention relates to a multilayer circuit board used for an electrical circuit board or the like, and more particularly to a structure of a conductive layer for electric wiring in the multilayer circuit board.

2. Background of the Invention

In a conventional multilayer circuit board used for electric circuit boards or the like on which a semiconductor device such as a semiconductor integrated circuit device is mounted, an insulating layer composed of ceramics, e.g. alumina and a conductive layer for electric wiring composed of a metal having a high melting point, e.g. tungsten are overlaid alternatively to produce a multilayer circuit board.

In the conventional multilayer circuit board, a signal wiring conductor in the conductive layers for electric wiring is formed to have a strip line structure. In other words, wholly patterned ground layers are formed on and underneath the conductive layer formed as the signal wiring conductor, via insulating layers.

For the purpose of stabilizing the power supply to the semiconductor device mounted on the multilayer circuit board, a capacitance has been generated between the ground layer and the conductive layer for power supply by overlaying the wholly patterned ground layer formed in the multilayer circuit board and the conductive layer functioning as a power wiring conductor alternatively.

Furthermore, for adapting to electrical signals to be processed by the multilayer circuit board becoming increasingly faster, the multilayer circuit board has been produced in the following manner: first forming an insulating layer of a polyimide resin or epoxy resin having a comparably small relative dielectric constant of 3.5 to 5.0 in place of the alumina ceramics with a relative dielectric constant of about 10; forming a conductive layer for electrical wiring formed of a copper (Cu) on the insulating layer by the use of a thin-film formation technique employing the vapor phase deposition methods such as vacuum evaporation or sputtering; and forming a fins wiring pattern by the photolithography to thereby overlay the insulating layer and the conductive layer. In this way, a multilayer circuit board with high density and excellent function, as well as capable of operating at high speed has been produced.

The above-mentioned multilayer circuit board in which the insulating layer is formed of a polyimide resin or epoxy resin, however, has a problem that even when the not-yet-reacted component in the resin and the water absorbed in the resin evaporate at the curing step in the overlaying process, a path for dissipating the not-yet-reacted component and the water to the outside air is cut out because of the solid plane formed on the resin layer, causing the solid plane to expand. In view of this problem, the ground layer has been formed to be mesh-like layer, so that it becomes difficult to make a capacitance which used to be generated in the conventional multilayer circuit board using the ceramics insulating layer, by overlaying the wholly patterned ground conductive layer and the conductive layer for power wiring. In this type of multilayer circuit board, therefore, a measure of mounting a chip capacitor on the multilayer circuit board has been taken.

In the case of forming the circuit board of multilayer structure using the conventional insulating film of polyimide or epoxy resin, however, the ground layer has been formed into a mesh-like layer. The conductive layer for signal wiring interposed between the mesh-like ground layers via the insulating layers from top and bottom thereof is arranged so as to oppose to both a portion formed with a metal layer forming the mesh-like ground layer and a portion clear of the metal layer. As a result, the characteristic impedance of the signal wiring conductor varies depending on the positional relationship between the signal wiring conductor and the ground layer in this type of conventional multilayer circuit board, since the high-speed electrical signal, which has increasingly become faster according to the speed up of the semiconductor device in recent years, passing through the signal wiring conductor propagates through the signal wiring conductor having variable characteristic impedance, a problem arises that the signal is partly reflected and the input electrical signal is not correctly transmitted to an output side, causing erroneous operations of the electrical circuit and the semiconductor device.

Moreover, another problem relating to the power supply to the semiconductor device mounted on the multi layer circuit board has been recognized that the power required for power supply to the semiconductor device cannot be transmitted due to the inductance in the wiring from the chip capacitor for stabilizing the power supply to the semiconductor device, and the path length for power supply.

For solving the disadvantages in the conventional multilayer circuit board, in Japanese Unexamined Patent Publication JP-A 9-18156(1997) and the research report by University of Arkansas in U.S. *Modeling and Experimental Verification of the Interconnected Mesh Power System (IMPS) MCM Topologyy IEEE TRANSACTION ON COMPONENTS, PACKAGING, AND MANUFACTURING TECHNOLOGY—PART B. VOL. 20, NO. 1, FEBRUARY 1997, p 42–49, for example, solutions for eliminating the nonuniformity in the characteristic impedance of the signal wiring portion which is the problem in the mesh-like ground structure are disclosed. In these publications, the multilayer circuit board is formed in such a manner that: the power wiring conductor, ground wiring conductor and signal wiring conductor are formed in the same layer; the signal wiring conductor is arranged between the power wiring conductor and the ground wiring conductor to form a coplanar line structure; and then the coplaners are multilayered at the position of torsion.

In the multilayer circuit board employing the above-mentioned coplaner wiring structure, however, power is supplied from the chip capacitor to the semiconductor device via the power wiring conductor and the ground wiring conductor because there is not any capacitance made between the power wiring conductor and the ground wiring conductor. Accordingly, there arose a problem that the inductance components of the power wiring conductor and the ground wiring conductor, and the path for power supply increase, so that stable power supply becomes impossible to cause the erroneous operation of the semiconductor device.

SUMMARY OF THE INVENTION

The present invention was made in view of the above-mentioned problems and is directed to a multilayer circuit board in which a capacitance is made between a power wiring conductor and a ground layer while keeping a characteristic impedance of a signal wiring conductor to uniform, whereby a power supply can be arranged close to a semiconductor device, as well as characteristic impedances of the power wiring conductor and the ground layer and then a composite characteristic impedance of a power supply path are decreased to provide a stable power supply to the semiconductor device and prevent the erroneous operation of the semiconductor device.

In a first aspect of the invention, there is provided a multilayer circuit board comprising;
- a first insulating layer, on a top of which a first power wiring conductor and a first ground wiring conductor are arranged substantially parallel to each other;
- a second insulating layer, on a top of which a second power wiring conductor, a second ground wiring conductor and a first signal wiring conductor between the second power wiring conductor and the second ground wiring conductor are arranged substantially parallel to each other;
- a third insulating layer, on a top of which a third power wiring conductor, a third ground wiring conductor and a second signal wiring conductor between the third power wiring conductor and the third ground wiring conductor are arranged substantially parallel to each other; and
- a fourth insulating layer, on a top of which a fourth power wiring conductor and a fourth ground wiring conductor are arranged substantially parallel to each other,
- the first to fourth insulating layers being sequentially overlaid in such a manner that:
  - the first power wiring conductor and the second ground wiring conductor, as well as the first ground wiring conductor and the second power wiring conductor are opposed to each other nearly in parallel via the second insulating layer interposed therebetween;
  - the third power wiring conductor and the fourth ground wiring conductor, as well as the third ground wiring conductor and the fourth power wiring conductor are opposed to each other nearly in parallel via the fourth insulating layer interposed therebetween; and
  - each wiring on the first insulating layer and the second insulating layer intersects with each wiring on the third insulating layer and the fourth insulating layer at almost right angles,
- wherein the first to fourth power wiring conductors and the first to fourth ground wiring conductors are connected to each other via through conductors.

In a second aspect of the invention, there is provided a multilayer circuit board comprising:
- a first insulating layer, on a top of which a first power wiring conductor, a first ground wiring conductor and a first signal wiring conductor between the first power wiring conductor and the first ground wiring conductor are arranged substantially parallel to each other;
- a second insulating layer, on a top of which a second power wiring conductor and a second ground wiring conductor are arranged substantially parallel to each other;
- a third insulating layer, on a top of which a third power wiring conductor, a third ground wiring conductor and a second signal wiring conductor between the third power wiring conductor and the third ground wiring conductor are arranged substantially parallel to each other; and
- a fourth insulating layer, on a top of which a fourth power wiring conductor and a fourth ground wiring conductor are arranged substantially parallel to each other,
- the first to fourth insulating layers being sequentially overlaid in such a manner that:
  - the first power wiring conductor and the second ground wiring conductor, as well as the first ground wiring conductor and the second power wiring conductor are opposed to each other nearly in parallel via the second insulating layer interposed therebetween;
  - the third power wiring conductor and the fourth ground wiring conductor, as well as the third ground wiring conductor and the fourth power wiring conductor are opposed to each other nearly in parallel via the fourth insulating layer interposed therebetween; and
  - each wiring on the first insulating layer and the second insulating layer intersects with each wiring on the third insulating layer and the fourth insulating layer at almost right angles,
- wherein the first to fourth power wiring conductors and the first to fourth ground wiring conductors are connected to each other via through conductors.

In a third aspect of the invention, there is provided a multilayer circuit board comprising:
- a first insulating layer, on a top of which a first power wiring conductor, a first ground wiring conductor and a first signal wiring conductor between the first power wiring conductor and the first ground wiring conductor are arranged substantially parallel to each other;
- a second insulating layer, on a top of which a second power wiring conductor and a second ground wiring conductor are arranged substantially parallel to each other;
- a third insulating layer, on a top of which a third power wiring conductor and a third ground wiring conductor are arranged substantially parallel to each other; and
- a fourth insulating layer, on a top of which a fourth power wiring conductor, a fourth ground wiring conductor and a second signal wiring conductor between the fourth power wiring conductor and the fourth ground wiring conductor are arranged substantially parallel to each other,
- the first to fourth insulating layers being sequentially overlaid in such a manner that:
  - the first power wiring conductor and the second ground wiring conductor, as well as the first ground wiring conductor and the second power wiring conductor are opposed to each other nearly in parallel via the second insulating layer interposed therebetween;
  - the third power wiring conductor and the fourth ground wiring conductor, as well as the third ground wiring conductor and the fourth power wiring conductor are opposed to each other nearly in parallel via the fourth insulating layer interposed therebetween; and
  - each wiring on the first insulating layer and the second insulating layer intersects with each wiring on the third insulating layer and the fourth insulating layer at almost right angles,
- wherein the first to fourth power wiring conductors and the first to fourth ground wiring conductors are connected to each other via through conductors.

In a fourth aspect of the invention, there is provided a multilayer circuit board comprising:
- a first insulating layer, on a top of which a first power wiring conductor and a first ground wiring conductor are arranged substantially parallel to each other;
- a second insulating layer, on a top of which a second power wiring conductor, a second ground wiring conductor and a first signal wiring conductor between the second power wiring conductor and the second ground wiring conductor are arranged substantially parallel to each other;
- a third insulating layer, on a top of which a third power wiring conductor and a third ground wiring conductor are arranged substantially parallel to each other; and a fourth insulating layer, on a top of which a fourth power wiring conductor, a fourth ground wiring conductor and a second signal wiring conductor between the fourth power wiring conductor and the fourth ground wiring conductor are arranged substantially parallel to each other, the first to fourth insulating layers being sequentially overlaid in such a manner that:

the first power wiring conductor and the second ground wiring conductor, as well as the first ground wiring conductor and the second power wiring conductor are opposed to each other nearly in parallel via the second insulating layer interposed therebetween;

the third power wiring conductor and the fourth ground wiring conductor, as well as the third ground wiring conductor and the fourth power wiring conductor are opposed to each other nearly in parallel via the fourth insulating layer interposed therebetween; and each wiring on the first insulating layer and the second insulating layer intersects with each wiring on the third insulating layer and the fourth insulating layer at almost right angles, wherein the first to fourth power wiring conductors and the first to fourth ground wiring conductors are connected to each other via through conductors.

In the multilayer circuit board according to the invention, the first signal wiring conductor is arranged nearly in parallel between the second power wiring conductor and the second ground wiring conductor or between the first power wiring conductor and the first ground wiring conductor, while the second signal wiring conductor is arranged nearly in parallel between the third power wiring conductor and the third ground wiring conductor or between the fourth power wiring conductor and the fourth ground wiring conductor. Since each of the signal wiring conductors constitutes a so-called coplanar line structure, a stable characteristic impedance can be obtained while keeping the characteristic impedance of the signal wiring conductor uniform.

When the first signal wiring conductor is made to connect with the ground wiring conductors by the operation of a semiconductor device, the first signal wiring conductor is electromagnetically coupled with the first and second ground wiring conductors. On the other hand, when the first signal wiring conductor is made to connect with the power wiring conductors by the operation of the semiconductor device, it is electromagnetically coupled with the first power and second power wiring conductors. In this way, the first signal wiring conductor is electromagnetically coupled with the power wiring conductors and the ground wiring conductors in a stable manner regardless of the operation condition of the semiconductor device. As a result, a stable characteristic impedance can be obtained.

According to the invention, on the first insulating layer on which the first power wiring conductor and the first ground wiring conductor are arranged substantially parallel to each other, the second insulating layer on which the second power wiring conductor and the second ground wiring conductor are arranged substantially parallel to each other is overlaid so that the first power wiring conductor and the second ground wiring conductor are opposed to each other nearly in parallel while interposing the second insulating layer therebetween and that the first ground wiring conductor and the second power wiring conductor are opposed to each other nearly in parallel while interposing the second insulating layer therebetween. Also, on the third insulating layer on which the third power Wiring conductor and the third ground wiring conductor are arranged substantially parallel to each other, the fourth insulating layer on which the fourth power wiring conductor and the fourth ground wiring conductor are arranged substantially parallel to each other is overlaid so that the third power wiring conductor and the fourth ground wiring conductor are opposed to each other nearly in parallel while interposing the fourth insulating layer therebetween and that the third power wiring conductor and the fourth ground wiring conductor are opposed to each other nearly in parallel while interposing the fourth insulating layer therebetween. As a result of this, capacities are formed between the first power wiring conductor and the second ground wiring conductor, between the first ground wiring conductor and the second power wiring conductor, between the third power wiring conductor and the fourth ground wiring conductor and between the third ground wiring conductor and the fourth power wiring conductor, respectively, via the insulating layers. As is apparent from the general formula for the characteristic impedance $Z_0 = \sqrt{(L/C)}$, an increase in the capacitance between power wiring conductor and the ground wiring conductor causes a composite impedance between each wiring to decrease, allowing a stable power supply to the semiconductor device mounted on the multilayer circuit board and thus preventing an erroneous operation of the semiconductor device.

Furthermore, according to the invention, since the first to fourth insulating layers are overlaid in such a manner that each wiring on the first and the second insulating layers intersects with each wiring on the third and fourth insulating layers at almost right angles, and thus electromagnetic fields for signal propagation intersect at a right angle at the portion where each wiring intersects, it is possible to suppress an occurrence of a crosstalk at the intersecting portion.

According to the invention, a multilayer circuit board can be provided which stably supplies electric power to the semiconductor device stably while keeping the characteristic impedance of the signal wiring conductor to be uniform and is capable of preventing the erroneous operation of the semiconductor device.

In a fifth aspect of the invention, the multilayer circuit board is characterized in that the insulating layer used in the multilayer circuit board is formed of an insulating resin having a relative dielectric constant of 2 to 5.

According to the invention, since the insulating layer is formed of the insulating resin having a relative dielectric constant of 2 to 5, the insulating layer has a smaller relative dielectric constant compared to the conventional insulating layer formed of alumina (with a relative dielectric constant of 10) or glass ceramics(with a relative dielectric constant of 10). so that electrical characteristics such as a propagation delay time of the signal is improved. Moreover, since the insulating resin is an organic resin, it is possible to form the insulating layer in a simple manner by using a spin coating method or the like, and also possible to overlay the layers easily.

In a sixth aspect of the invention, the multilayer circuit board is characterized in that the insulating layer used in the multilayer circuit board is formed of an insulating resin selected from the group consisting of fluororesins, polynorbornene resins, benzocyclobutene resins, polyimlde resins and epoxy resins.

According to the invention, above-mentioned insulating material is used for forming the insulating layer. The fluororesin and polynorbornene resin have a low relative dielectric constant of 2.0 to 2.2 and have good electric characteristics. The benzocyclobutene resin has a relative dielectric constant of 2.7 and is inferior to the fluororesin and the polynorbornene resin in terms of electric characteristics, whereas it is superior to these resins in terms of adhesion to the metal used for wiring. The polyimide resin has a relative dielectric constant of 3.0 to 3.5, so it is inferior to the aforementioned resins in terms of electric characteristics. However, the polyimide resin have advantages that a crack will not be caused even when the polyimide resin layer is formed to have a thickness of 70 μm or more, and it has a good adhesion to the metal as is the benzocyclobutene resin. Though the epoxy resin has a higher relative dielectric constant of 4.5 to 5.0 compared to the aforementioned resins, the temperature at the formation of layers can be lowered to between 150° C. and 180° C. and thus an oxidation of the metal is prevented to more extent compared to the processing temperature of 400° C. for the polyimide resin.

In a seventh aspect of the invention, the multilayer circuit board is characterized in that the first insulating layer has a thickness of 3 μm to 20 μm, the third insulating layers has a thickness of 0.5 μm to 20 μm and that second and fourth insulating layers have a thickness of 0.5 μm to 3 μm.

In case the thickness of the first insulting layer is less than 3 μm, the signal, power and ground wiring conductors would be given a surface roughness affected by the surface roughness of the ceramic substrate used as the base, and also affected by the dielectric constant of the ceramic substrate as the base, making the propagation of the high-speed signal difficult. In case the thickness of the third insulating layer is less than 0.5 μm, enough insulation would not be secured between the wiring conductors disposed on and under the third insulating layer. Though the upper limit for the thickness of the first and third insulating layer is not restricted from the view of the electrical characteristics, they preferably have a thickness of 20 μm or less considering that at larger thicknesses it becomes difficult to electrically connect the insulating layers via the through conductor. Furthermore, in case the second and fourth insulating layers have a thickness of less than 0.5 μm, an insulation failure would be caused between the power wiring conductor and the ground wiring conductor. And in case the second and fourth insulating layers have a thickness of more than 3 μm, enough capacitance would not be secured between the power wiring conductor and the ground wiring conductor.

In an eighth aspect of the invention, the multilayer circuit board is characterized in that each of the first to fourth power wiring conductors, the first to fourth ground wiring conductors and the first and second signal wiring conductors has a main conductive metal layer formed of copper, gold or silver.

According to the invention, each wiring of the multilayer circuit board has a main conductive metal layer formed of copper, gold or silver. Each wiring preferably has a low conductive resistance, and copper is generally used to this end. In the case of rather lower resistance being required, silver is used. Copper and silver, however, undergo oxidation to form oxides and will cause a loss of reliability. Therefore, to obtain a wiring which is stable over the long run, gold is used for the main conductive metal layer.

In a ninth aspect of the invention, the multilayer circuit board is characterized in that the main conductive metal layer of each wiring has a thickness of between 1 μm to 10 μm.

In case the thickness of the main conductive metal layer is less than 1 μm, the resistance of the wiring conductor becomes higher, and it becomes difficult to secure a good power supply to the semiconductor device and a stable ground, as well as good propagation of the signal. In case the thickness is more than 10 μm, the coating by the insulating layer becomes insufficient to cause an insulation failure.

In a tenth aspect of the invention, the multilayer circuit board is characterized in that each of the first to fourth power wiring conductors, first to fourth ground wiring conductors and first and second signal wiring conductors has the main conductive layer and an adhesion metal layer formed of chromium, titanium, molybdenum or niobium.

According to the invention, each wiring has the main conductive metal layer and the adhesion metal layer formed of the above-mentioned metals. Since copper, gold or silver constituting the main conductive metal layer is low in oxidation energy, the adhesive thereof to the insulating layer is poor. To make up for this, the adhesion metal layer formed of chromium, titanium, molybdenum or niobium having a high oxidation energy and thus a high adhesive to the insulating layer is employed. Titanium and niobium are high in oxidation energy and thus good adhesives to the insulating layer, but they form intermetallic compounds between copper. The intermetallic compound grows to a layer as the time elapses and causes the adhesive of the contact layer to be reduced. Though chromium and molybdenum are inferior to titanium and niobium in terms of the adhesive to the insulating layer, they do not form the intermetallic compound between copper and keep a good adhesive for the long term.

In an eleventh aspect of the invention, the multilayer circuit board is characterized in that the adhesion metal layer of each wiring has a thickness of between 0.03 μm and 0.2 μm.

In case the thickness of the adhesion metal layer is less than 0.03 μm, sufficient effect is not obtained for improving the adhesion of the main conductive metal layer. In the case the thickness of the adhesion metal layer is more than 0.2 μm, on the contrary, the thickness of the metal (skin depth) engaging in the propagation of the signal of 10 GHz, for example, becomes 0.6 μm, so that the adhesive metal layer constitute one third of the skin depth. As a result, the main conductive metal layer formed of copper or silver having a low resistance would not function sufficiently.

BRIEF DESCRIPTION OF THE DRAWINGS

Other and further objects, features, and advantages of the invention will be more explicit from the following detailed description taken with reference to the drawings wherein.

DETAILED DESCRIPTION OF THE INVENTION

Now referring to the drawings, preferred embodiments of the invention are described below.

FIGS. 1A to 4C are plan views and section views of four embodiments of the multilayer circuit board according to the invention. FIGS. 1A, 2A, 3A and 4A are plan views in perspective of the multilayer circuit board, seen from a slightly slanting direction; FIGS. 1B, 2B, 3B and 4B are section views in perspective of the multilayer circuit board shown in the plan view, seen from the bottom of the drawing; and FIGS. 1C, 2C, 3C and 4C section views in perspective of the multilayer circuit board shown in the plan view, seen from the right side of the drawing, for explaining the physical relationship among wiring conductors at a part of the multilayer circuit board.

As shown in FIGS. 1A to 4C, the multilayer circuit board comprises first to fourth insulating layers I1 to I4 on which first to fourth power wiring conductors P1 to P4 and first to fourth ground wiring conductors G1 to G4 are disposed, and first signal wiring conductor S1 is disposed on the first or second insulating layer I1 or I2, and second signal wiring conductor S2 is disposed on the third or fourth insulating layer I3 or I4. The respective wiring conductors on the same insulating layer are placed substantially in parallel to each other, and the first power wiring conductor P1 and second ground wiring conductor G2 are opposed to each other nearly in parallel via an insulating layer interposed therebetween, and the first ground wiring conductor G1 and second power wiring conductor P2, the third power wiring conductor P3 and fourth ground wiring conductor G4, and the third ground wiring conductor G3 and fourth power wiring conductor P4 are also opposed to each other nearly in parallel via an insulating layer interposed therebetween. Furthermore, the second and third power wiring conductors P2 and P3 are connected by a first through-hole conductor T1, the first and fourth ground wiring conductors G1 and G4 by a second through-hole conductor T2, the first and second signal wiring conductors S1 and S2 by a third through-hole conductor T3, the second and third ground wiring conductors G2 and G3 by a fourth through-hole conductor T4, and the first and fourth power wiring conductors by a fifth through-hole conductor T5, respectively. The through conductors T1 to T5 serves as through conductors In the first embodiment of FIGS. 1A to 1C, the first power wiring conductor P1 and the first ground wiring conductor G1 are placed on the first insulating layer I1; the second power wiring conductor P2, the second ground wiring conductor G2, and the first signal wiring conductor S1 provided between them are placed on the second insulating layer I2; the third power wiring conductor P3, the third ground wiring conductor G3, and the second signal wiring conductor S2 provided between them are placed on the third insulating layer I3; and the fourth power wiring conductor P4 and the fourth ground wiring conductor G4 are placed on the fourth insulating layer I4.

Figure 1A:
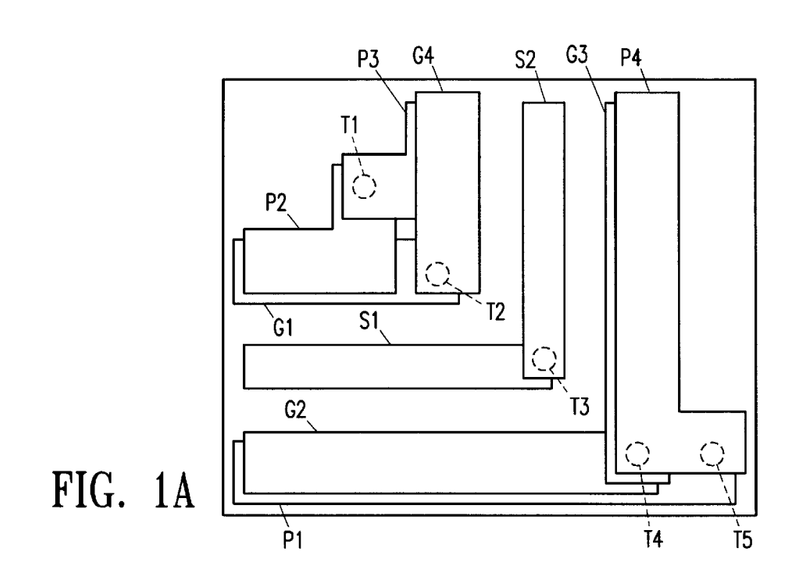
FIG. 1A is a plan view and FIGS. 1B and 1C are section views of a first embodiment of the multilayer circuit board according to the invention.
Figure 1B:
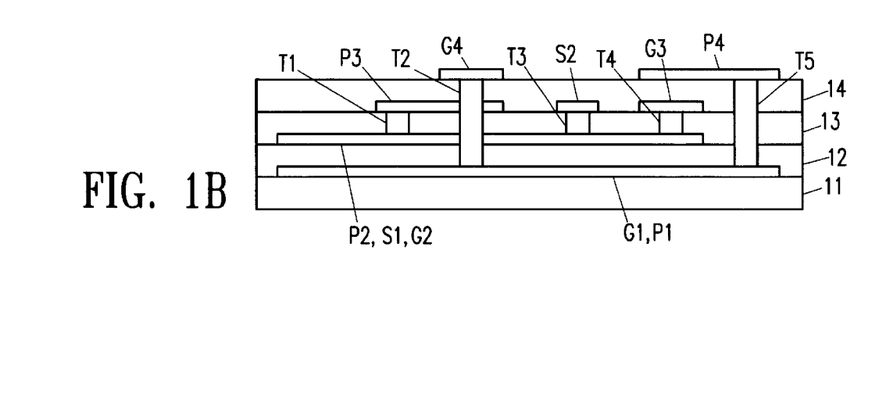
Figure 1C:
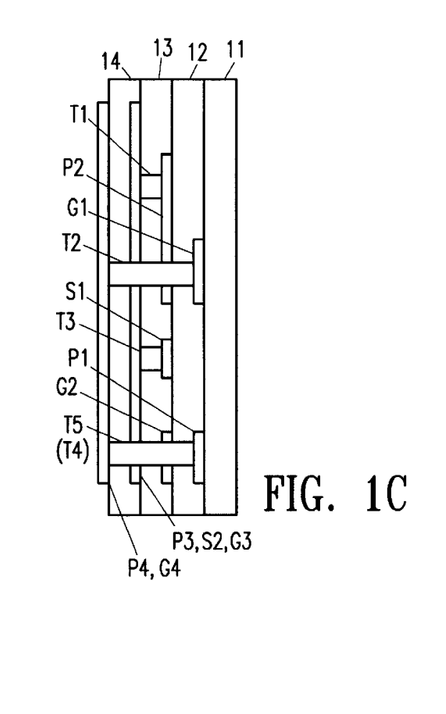

Further, the second and third power wiring conductors P2 and P3 are connected to each other via the through-hole conductor T1, the first and fourth ground wiring conductors G1 and G4 via the through-hole conductor T2, the first and second signal wiring conductors S1 and S2 via the through-hole conductor T3, the second and third ground wiring conductors G2 and G3 via the through-hole conductor T4, and the first and fourth power wiring conductors P1 and P4 via the through-hole conductor T5, respectively. The first and second signal wiring conductors S1 and S2 may be separated from each other to serve as wiring conductors for transmitting a different kind of signal, respectively.

In the embodiment shown in FIGS. 1A to 1C, the first ground wiring conductor G1 and the first power wiring conductor P1 are disposed substantially in parallel to each other on the first insulating layer I1, and the first power wiring conductor P1 has an end for connecting via the through-hole conductor T5 with the fourth power wiring conductor P4 placed upward. This end for connecting the first power wiring conductor P1 and the fourth power wiring conductor P4, when the first and second signal wiring conductors S1 and S2 are placed at right angles with each other via the through-hole conductor T3 as shown in FIGS. 1A to 1C is provided outside an angle formed by the second ground wiring conductor G2 and the third ground wiring conductor G3 which is connected thereto via the through-hole conductor T4. The ground wiring conductors G2 and G3 and the power wiring conductors P1 and P4 are thereby placed away from the signal wiring conductors S1 and S2, with the result that the characteristic impedance of the signal wiring conductors S1 and S2 can be held constant.

Further, the first ground wiring conductor G1 has an end for connecting via the through-hole conductor T2 with the ground wiring conductor G4 provided upward, and in this embodiment, the first and fourth ground wiring conductors G1 and G4 are placed at right angles with each other via the through-hole conductor T2.

The second ground wiring conductor G2, the second power wiring conductor P2, and the first signal wiring conductor S1 placed between them are placed substantially in parallel to each other on the second insulating layer I2. The second ground wiring conductor G2 and the second power wiring conductor P2 are positioned just above the first power wiring conductor P1 and the first ground wiring conductor G1, respectively, to be opposed thereto nearly in parallel via the second insulating layer I2 interposed therebwetween to make a capacitance. Further, the second power wiring conductor P2 has an end for connecting via the through-hole conductor T1 with the third power wiring conductor P3 placed upward. This end for connecting the second power wiring conductor P2 and the third power wiring conductor P3, when the first and second signal wiring conductors S1 and S2 are placed at right angles with each other via the through-hole conductor T3 as shown in FIGS. 1A to 1C is provided inside an angle formed by the first ground wiring conductor G1 and the fourth ground wiring conductor G4 which is connected thereto via the through-hole conductor T2. The ground wiring conductors G1 and G4 and the power wiring conductors P2 and P3 are thereby placed away from the signal wiring conductors S1 and S2, with the result that the characteristic impedance of the signal wiring conductors S1 and S2 can be held constant.

Further, the second ground wiring conductor G2 has an end for connecting via the through-hole conductor T4 with the third ground wiring conductor G3 placed upward. In this embodiment, the second and third ground wiring conductors G2 and G3 are placed at right angles with each other via the through-hole conductor T4.

The third ground wiring conductor G3, the third power wiring conductor P3, and the second signal wiring conductor S2 provided between them are placed substantially in parallel to each other on the third insulating layer I3, each of these wiring conductors being placed so as to intersect at right angles with the respective wiring conductors placed on the first and second insulating layers I1 and I2.

The third power wiring conductor P3 has an end for connecting via the through-hole conductor T1 with the second power wiring conductor P2 placed downward, inside the right angle formed thereby. The third ground wiring conductor G3 has an end for connecting via the through-hole conductor T4 with the second ground wiring conductor G2 placed downward. Further, the second signal wiring conductor S2 is connected to the first signal wiring conductor S1 via the through-hole conductor T3 in the same manner.

The fourth ground wiring conductor G4 and the fourth power wiring conductor P4 are placed substantially in parallel to each other on the fourth insulating layer I4. The fourth ground wiring conductor G4 and the fourth power wiring conductor P4 are positioned just above the third power wiring conductor P3 and the third ground wiring conductor G3, respectively, to be opposed thereto nearly in parallel via the fourth insulating layer I4 interposed therebetween to make a capacitance. They are also placed so as to intersect at substantially right angles with the respective wiring conductors disposed on the first and second insulating layers I1 and I2.

The fourth power wiring conductor P4 has an end for connecting via the through-hole conductor T5 with the first power wiring conductor P1 placed downward, outside the right angle formed thereby. The fourth ground wiring conductor G4 has an end for connecting via the through-hole conductor T2 with the first ground wiring conductor G1 placed downward.

According to the multilayer circuit board with a configuration as shown in FIGS. 1A to 1C, each of the power wiring conductors and ground wiring conductors has a uniform positional relationship with the signal wiring conductors all over the wiring region of the signal wiring conductors, so that the characteristic impedance of the signal wiring conductors is held constant to be capable of propagating signals in stable. At the same time, since a composite impedance between the power wiring conductors and the ground wiring conductors is lowered due to the capacitance between the power wiring conductors and the ground wiring conductors, it is possible to supply power in stable to a semiconductor device to be mounted.

Figure 2A:
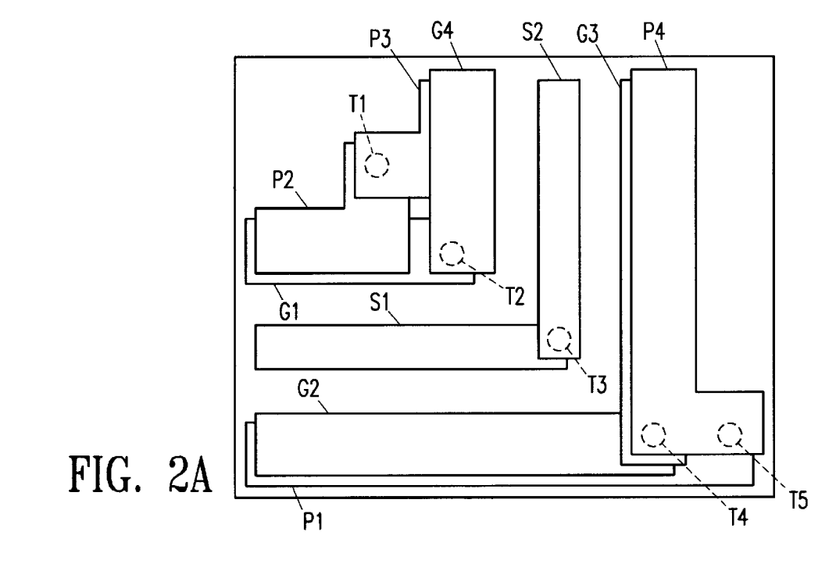
FIG. 2A is a plan view and FIGS. 2B and 2C are section views of a second embodiment of the multilayer circuit board according to the invention.
Figure 2B:
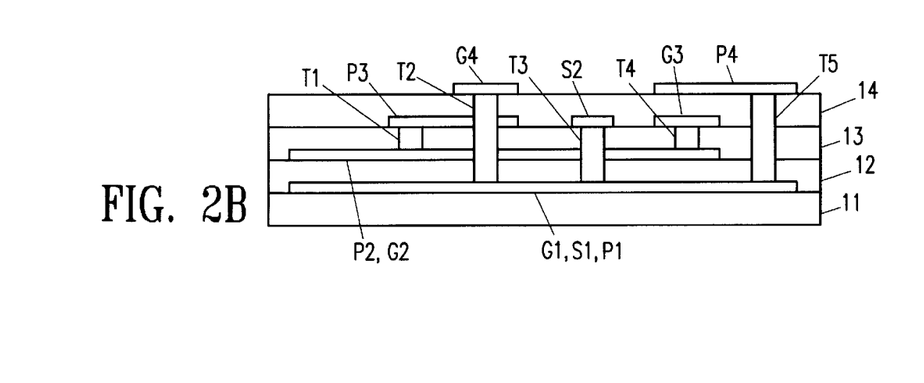
Figure 2C:
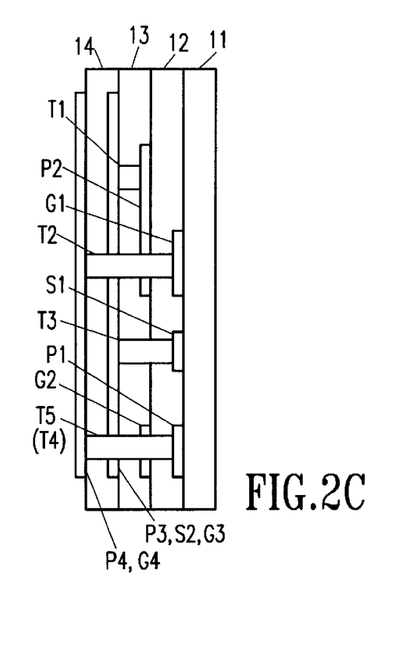

Next, the second embodiment shown in FIGS. 2A to 2C illustrates that: the first power wiring conductor P1, the first ground wiring conductor G1, and the first signal wiring conductor S1 provided between them are placed on the first insulating layer I1; the second power wiring conductor P2 and the second ground wiring conductor G2 are placed on the second insulating layer I2; the third power wiring conductor P3, the third ground wiring conductor G3, and the second signal wiring conductor S2 provided between them are placed on the third insulating layer I3; and the fourth power wiring conductor P4 and the fourth ground wiring conductor G4 are placed on the fourth insulating layer I4.

Further, the second and third power wiring conductors P2 and P3 are connected to each other via the through-hole conductor T1, the first and fourth ground wiring conductors G1 and G4 via the through-hole conductor T2, the first and second signal wiring conductors S1 and S2 via the through-hole conductor T3, the second and third ground wiring conductors G2 and G3 via the through-hole conductor T4, and the first and fourth power wiring conductors P1 and P4 via the through-hole conductor T5, respectively. The first and second signal wiring conductors S1 and S2 may be separated from each other so as to serve as wiring conductors for transmitting a different kind of signal, respectively.

In the embodiment shown in FIGS. 2A to 2C the first ground wiring conductor G1, the first power wiring conductor P1, and the first signal wiring conductor S1 provided between them are placed substantially parallel to each other on the first insulating layer I1, and the first power wiring conductor P1 has an end for connecting via the through-hole conductor T5 with the fourth power wiring conductor P4 placed upward, outside the right angle formed thereby.

Further, the first ground wiring conductor G1 has an end for connecting via the through-hole conductor T2 with the fourth ground wiring conductor G4 placed upward. Also in this embodiment, the first and fourth ground wiring conductors G1 and G4 are placed at right angles with each other via the through-hole conductor T2.

The second ground wiring conductor G2 and the second power wiring conductor P2 are placed substantially parallel to each other on the second insulating layer I2. The second ground wiring conductor G2 and the second power wiring conductor P2 are positioned just above the first power wiring conductor P1 and the first ground wiring conductor G1, respectively, to be opposed thereto nearly in parallel via the second insulating layer I2 interposed therebetween to make a capacitance. Still more, the second power wiring conductor P2 has an end for connecting via the through-hole conductor T1 with the third power wiring conductor P3 placed upward, inside the right angle formed thereby.

Further, the second ground wiring conductor G2 has an end for connecting via the through-hole conductor T4 with the third ground wiring conductor G3 placed upward. Also in this embodiment, the second and third ground wiring conductors G2 and G3 are placed at right angles with each other via the through-hole conductor T4.

The third ground wiring conductor G3, the third power wiring conductor P3, and the second signal wiring conductor S2 provided between them are placed substantially parallel to each other on the third insulating layer I3, each of these wiring conductors being placed so as to cross at substantially right angles with the respective wiring conductors placed on the first and second insulating layers I1 and I2.

The third power wiring conductor P3 has an end for connecting via the through-hole conductor T1 with the second power wiring conductor P2 placed downward, inside the right angle formed thereby. The third ground wiring conductor G3 has an end for connecting via the through-hole conductor T4 with the second ground wiring conductor G2 placed downward. Further, the second signal wiring conductor S2 is connected to the first signal wiring conductor S1 via the through-hole conductor T3 in the same manner.

The fourth ground wiring conductor G4 and the fourth power wiring conductor P4 are placed substantially in parallel to each other on the fourth insulating layer I4. The fourth ground wiring conductor G4 and the fourth power wiring conductor P4 are positioned just above the third power wiring conductor P3 and the third ground wiring conductor G3, respectively, to be opposed thereto nearly in parallel via the fourth insulating layer I4 interposed therebetween to make a capacitance. They are also placed so as to intersect at substantially right angles with the respective wiring conductors placed on the first and second insulating layers I1 and I2.

The fourth power wiring conductor P4 has an end for connecting via the through-hole conductor T5 with the first power wiring conductor P1 placed downward, outside the right angle formed thereby. The fourth ground wiring conductor G4 has an end for connecting via the through-hole conductor T2 with the first ground wiring conductor G1 placed downward.

Also according to the multilayer circuit board with a configuration as shown in FIGS. 2A to 2C each of the power wiring conductors and ground wiring conductors has a uniform physical relationship with the signal wiring conductors all over the wiring region of the signal wiring conductors, so that the characteristic impedance of the signal wiring conductors is held constant to be capable of propagating signals in stable. And, since the composite impedance between the power wiring conductor and the ground wiring conductor is lowered due to the capacitance between the power wiring conductor and the ground wiring conductor, it is possible to supply power in stable to a semiconductor device to be mounted.

Figure 3A:
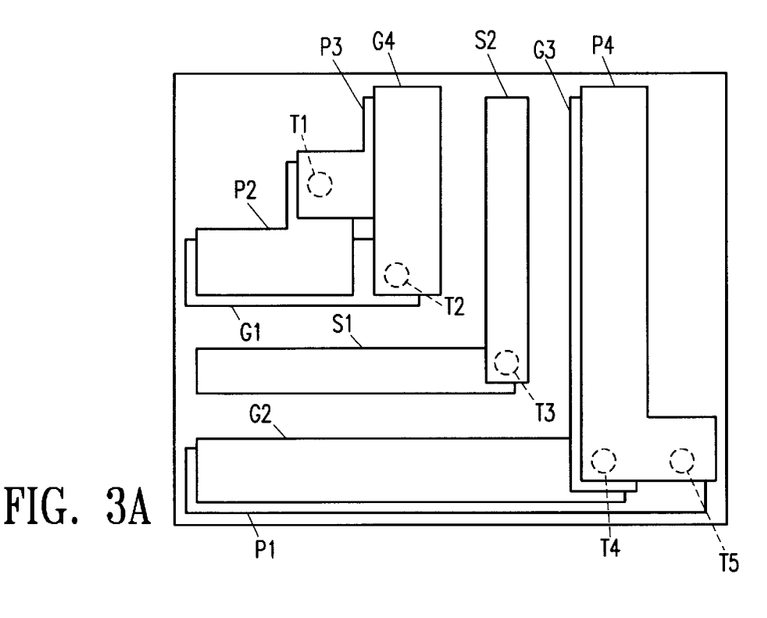
FIG. 3A is a plan view and FIGS. 3B and 3C are section views of a third embodiment of the multilayer circuit board according to the invention.
Figure 3B:
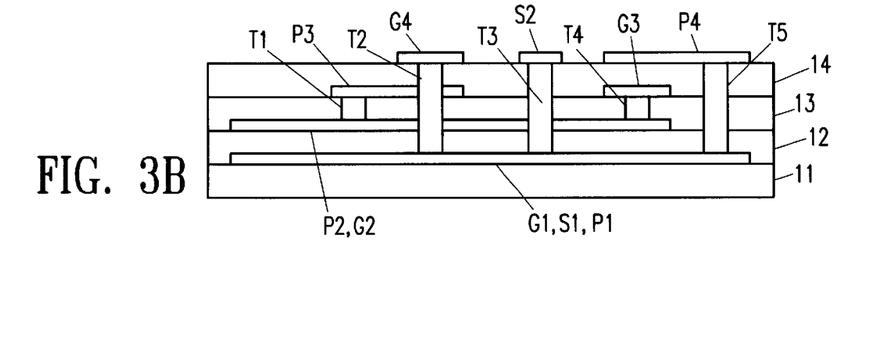
Figure 3C:
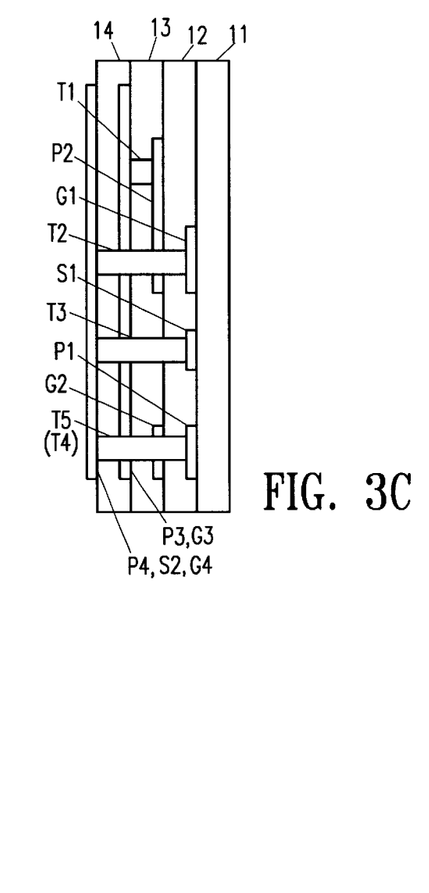

Next, the third embodiment shown in FIGS. 3A to 3C shows that: the first power wiring conductor P1, the first ground wiring conductor G1, and the first signal wiring conductor S1 provided between them are placed on the first insulating layer I1; the second power wiring conductor P2 and the second ground wiring conductor G2 are placed on the second insulating layer I2; the third power wiring conductor P3 and the third ground wiring conductor G3 are placed on the third insulating layer I3; and the fourth power wiring conductor P4, the fourth ground wiring conductor G4, and the second signal wiring conductor S2 provided between them are placed on the fourth insulating layer I4.

Further, the second and third power wiring conductors P2 and P3 are connected via the first through-hole conductor T1, the first and fourth ground wiring conductors G1 and G4 via the second through-hole conductor T2, the first and second signal wiring conductors S1 and S2 via the third through-hole conductor T3, the second and third ground wiring conductors G2 and G3 via the through-hole conductor T4, and the first and fourth power wiring conductors P1 and P4 via the fifth through-hole conductor T5, respectively. The first and second signal wiring conductors S1 and S2 may be separated from each other so as to transmit a different kind of signal, respectively.

In the embodiment shown in FIGS. 3A to 3C, the first ground wiring conductor G1, the first power wiring conductor P1, and the first signal wiring conductor S1 provided between them are placed substantially in parallel to each other on the first insulating layer I1, and the first power wiring conductor P1 has an end for connecting via the through-hole conductor T5 with the fourth power wiring conductor P4 placed upward, outside the right angle formed thereby.

Further, the first ground wiring conductor G1 has an end for connecting via the through-hole conductor T2 with the fourth ground wiring conductor G4 placed upward. Also in this embodiment, the first and fourth ground wiring conductor G1 and G4 are placed at right angles with each other via the through-hole conductor T2.

The second ground wiring conductor G2 and the second power wiring conductor P2 are placed substantially in parallel to each other on the second insulating layer I2. The second ground wiring conductor G2 and the second power wiring conductor P2 are positioned just above the first power wiring conductor P1 and the first ground wiring conductor G1, respectively, to be opposed thereto nearly in parallel via the second insulating layer I2 interposed therebetween to make a capacitance. Further, the second power wiring conductor P2 has an end for connecting via the through-hole conductor T1 with the third power wiring conductor P3 placed upward, inside the right angle formed thereby.

Further, the second ground wiring conductor G2 has an end for connecting via the through-bole conductor T4 with the third ground wiring conductor G3 placed upward. Also in this embodiment, the second and third ground wiring conductors G2 and G3 are placed at right angles with each other via the through-hole conductor T4.

The third ground wiring conductor G3 and the third power wiring conductor P3 are placed substantially parallel to each other on the third insulating layer I3, each of the wiring conductors being placed so as to intersect at substantially right angles with the respective wiring conductors placed on the first and second insulating layers I1 and I2.

The third power wiring conductor P3 has an end for connecting via the through-hole conductor T1 with the second power wiring conductor P2 placed downward, inside the right angle formed thereby. The third ground wiring conductor G3 has an end for connecting via the through-hole conductor T4 with the second ground wiring conductor G2 placed downward.

The fourth ground wiring conductor G4 and the fourth power wiring conductor P4, and the second signal wiring conductor S2 provided between them are placed substantially in parallel to each other on the fourth insulating layer I4. The fourth ground wiring conductor G4 and the fourth power wiring conductor P4 are positioned just above the third power wiring conductor P3 and the third ground wiring conductor G3, respectively, to be opposed thereto nearly in parallel via the fourth insulating layer 14 interposed therebetween to make a capacitance. They are also placed so as to intersect at substantially right angles with the respective wiring conductors placed on the first and second insulating layers I1 and I2.

The fourth power wiring conductor P4 has an end for connecting via the through-hole conductor T5 with the first power wiring conductor P1 placed downward, outside the right angle formed thereby. The fourth ground wiring conductor G4 has an end for connecting via the through-hole conductor T2 with the first ground wiring conductor G1 placed downward. Further, the second signal wiring conductor S2 is connected to the first signal wiring conductor S1 via the through-hole conductor T3 in the same manner.

Also according to the multilayer circuit board with a configuration as shown in FIGS. 3A to 3C, each of the power wiring conductors and ground wiring conductors has a uniform physical relationship with the signal wiring conductors all over the wiring region of the signal wiring conductors, so that the characteristic impedance of the signal wiring conductors is held constant to be capable of propagating signals in stable. And, since the composite impedance between the power wiring conductors and the ground wiring conductors is lowered due to the capacitance between the power wiring conductor and the ground wiring conductor, it is possible to supply power in stable to a semiconductor device to be mounted.

Figure 4A:
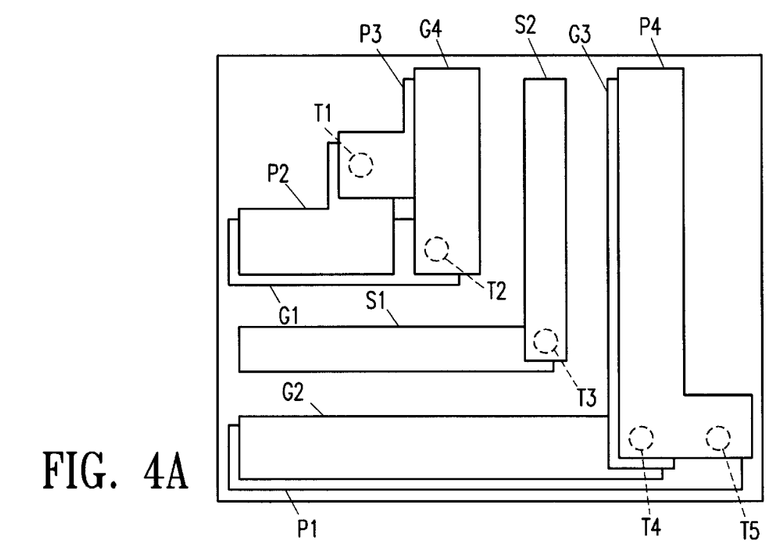
FIG. 4A is a plan view and FIGS. 4B and 4C are section views of a fourth embodiment of the multilayer circuit board according to the invention.
Figure 4B:
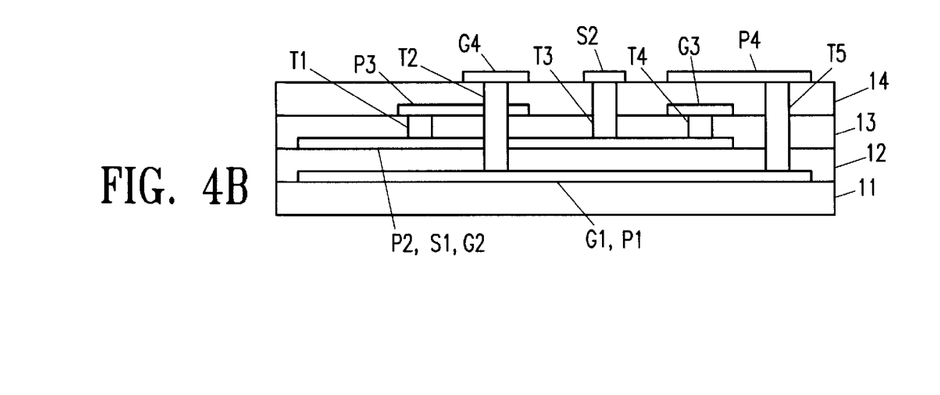
Figure 4C:
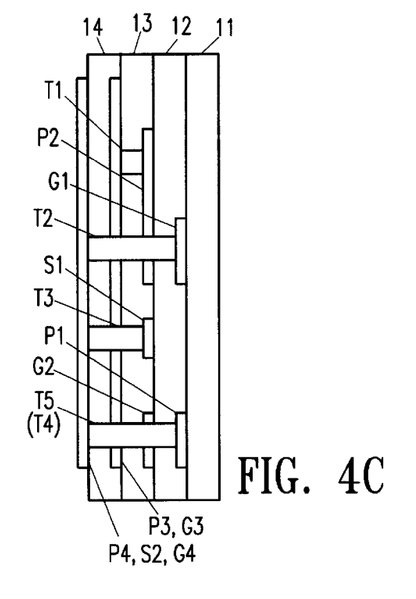

Next, in the fourth embodiment shown in FIGS. 4A to 4C are disposed the first power wiring conductor P1 and the first ground wiring conductor G1 on the first insulating layer I1; the second power wiring conductor P2, the second ground wiring conductor G2, and the first signal wiring conductor S1 provided therebetween on the second insulating layer I2; the third power wiring conductor P3 and the third ground wiring conductor G3 on the third insulating layer I3; and the fourth power wiring conductor P4 and the fourth ground wiring conductor G4, and the second signal wiring conductor S2 provided therebetween on the fourth insulating layer I4.

Further, the second and third power wiring conductors P2 and P3 are connected to each other via the through-hole conductor T1, the first and fourth ground wiring conductors G1 and G4 via the through-hole conductor T2, the first and second signal wiring conductors S1 and S2 via the through-hole conductor T3, the second and third ground wiring conductors G2 and G3 via the through-hole conductor T4, and the first and fourth power wiring conductors P1 and P4 via the through-hole conductor T5, respectively. The first and second signal wiring conductors S1 and S2 may be separated from each other so as to serve as wiring conductors for transmitting a different kind of signal, respectively.

In the embodiment shown in FIGS. 4A to 4C, the first ground wiring conductor G1 and the first power wiring conductor P1 are placed substantially parallel to each other on the first insulating layer I1, and the first power wiring conductor P1 has an end for connecting via the through-hole conductor T5 with the fourth power wiring conductor P4 placed upward, outside the right angle thereby Further, the first ground wiring conductor G1 has an end for connecting via the through-hole conductor T2 with the fourth ground wiring conductor G4 placed upward. Also in this embodiment, the first and fourth ground wiring conductors G1 and G4 are placed at right angles with each other via the through-hole conductor T2.

The second ground wiring conductor G2 and the second power wiring conductor P2 are placed substantially parallel to each other on the second insulating layer I2. The second ground wiring conductor G2 and the second power wiring conductor P2 are positioned just above the first power wiring conductor P1 and the first ground wiring conductor G1, respectively, to be opposed thereto nearly in parallel via the second insulating layer I2 interposed therebetween to make a capacitance. Further, the second power wiring conductor P2 has an end for connecting via the through-hole conductor T1 with the third power wiring conductor P3 placed upward, inside the right angle formed thereby.

Further, the second ground wiring conductor G2 has an end for connecting with the third ground wiring conductor G3 placed upward via the through-hole conductor T4. Also in this embodiment, the second and third ground wiring conductors G2 and G3 are placed at right angles with each other via the through-hole conductor T4.

The third ground wiring conductor G3 and the third power wiring conductor P3 are placed substantially parallel to each other on the third insulating layer I3, each of these wiring conductors being placed so as to cross at substantially right angles with the respective wiring conductors placed on the first and second insulating layers I1 and I2.

The third power wiring conductor P3 has an end for connecting via the through-hole conductor T1 with the second power wiring conductor P2 placed downward, inside the right angle formed thereby. The third ground wiring conductor G3 has an end for connecting via the through-hole conductor T4 with the second ground wiring conductor G2 placed downward.

The fourth ground wiring conductor G4, the fourth power wiring conductor P4, and the second signal wiring conductor S2 provided between them are placed substantially parallel to each other on the fourth insulating layer I4. The fourth ground wiring conductor G4 and the fourth power wiring conductor P4 are positioned just above the third power wiring conductor P3 and the third ground wiring conductor G3, respectively, to be opposed thereto nearly in parallel via the fourth insulating layer I4 interposed therebetween to make a capacitance. They are also placed so as to cross at substantially right angles with the respective wiring conductors placed on the first and second insulating layers I1 and I2.

The fourth power wiring conductor P4 has an end for connecting via the through-hole conductor T5 with the first power wiring conductor P1 placed downward, outside the right angle formed thereby. The fourth ground conductor G4 has an end for connecting via the through-hole conductor T2 with the first ground wiring conductor G1 placed downward. Further, the second signal wiring conductor S2 is connected to the first signal wiring conductor S1 via the through-hole conductor T3 in the same manner.

Also according to the multilayer circuit board with a configuration as shown in FIGS. 4A to 4C, each of the power wiring conductors and ground wiring conductors has a uniform physical relationship with the signal wiring conductors all over the wiring region of the signal wiring conductors, so that the characteristic impedance of the signal wiring conductors is held constant to be capable of propagating signals in stable. And, since the composite impedance between the power wiring conductor and the ground wiring conductor is lowered due to the capacitance between the power wiring conductor and the ground wiring conductor, it is possible to supply power in stable to a semiconductor device to be mounted.

In the above-described multilayer circuit board according to the invention, a resin having a relative dielectric constant of 2 to 5 such as fluororesin, polynorbornene, benzocyclobutene, polyimide and epoxy resin is used for the first to fourth insulating layers I1 to I4. Therein is applied on a substrate by spin coating or the like to form a resin film.

On the surface of the resin film, a metal film of copper, aluminum or the like is formed, a predetermined via pattern or through-hole pattern for forming the through conductor is designed by photolithography, a via hole or a through hole is formed by, for example, reactive ion etching by using this via pattern or through-hole pattern as a metal mask. The metal mask is then removed, with the result that a predetermined via hole or through hole is formed on the resin. Otherwise, after a photosensitive resin (photosensitive benzocyclobutene, photosensitive polyimide, photosensitive epoxy or the like) is used to form the insulating layer, the via hole or the through hole is formed by photolithography. Otherwise, after the resin of the insulating layer is formed, the via hole or the through hole is directly formed by excimer laser.

In addition, with regard to the first to fourth power wiring conductors P1 to P4, the first to fourth ground wiring conductors G1 to G4 and the first and second signal wiring conductors S1 and S2, copper, gold or the like is used for a main conductive metal layer, and when necessary, chromium, titanium, molybdenum, niobium or the like may be used for an adhesion metal layer. These metal layers are formed by sputtering, vacuum evaporation, plating or the like, and a predetermined wiring pattern is designed by photolithography.

In the physical relation among the respective wiring conductors, it is preferable that the power wiring conductors and the ground wiring conductors are placed in a uniform physical relation with respect to the signal wiring conductors.

The multilayer circuit board according to the invention, in each of the above embodiments, may comprise an insulating substrate under the first insulating layer I1, and may comprise another insulating layer so as to cover the fourth insulating layer I4 and the respective wiring conductors placed thereon. Further, a plurality of wiring conductors may be placed for each kind, and various multilayer circuit boards configured by the first to fourth insulating layers I1 to I4 may be combined and overlaid on the multilayer circuit board configured by the first to fourth insulating layers I1 to I4.

In the multilayer circuit board of the invention, alumina ceramics or the like can be used for an insulating substrate placed under the first insulating layer I1. Such an insulating substrate is produced by mixing a suitable solvent with powder of ceramic raw material such as alumina ($Al_2O_3$) and silica ($SiO_2$) to generate slurry thereof, and making the slurry in a form of sheet by the conventionally known doctor blade method as well as firing the slurry in high temperature.

A base conductive layer of aluminum (Al) or the like is formed on this insulating substrate by conventionally known vapor phase deposition such as ion plating, sputtering and the like, and a polymeric material such as a polyimide resin is applied thereon by spin coating and curing process to form the first insulating layer I1.

Subsequently, a connecting via hole or through hole for realizing a multilayer configuration is formed by photolithography to form a base metal layer, a main conductive layer and a protecting metal layer on the first insulating layer I1 by the vapor phase deposition and to form the via-hole conductor or through-hole conductor as the through conductor. Also, the first power wiring conductor P1, the first ground wiring conductor G1 and, as specifications demand, the first signal wiring conductor S1 are formed.

Furthermore, a polyimide resin is applied on this first insulating layer I1 and the respective wiring conductors by conventionally known spin coating, and curing process, so that the second insulating layer I2 is formed so as to have a thickness of 1 μm to 3 μm.

Subsequently, the connecting via hole or through hole for realizing the multilayer configuration is formed by photolithography to form the base metal layer, the main conductive layer and the protecting metal layer on the second insulating layer I2 by the vapor phase deposition and to form the via-hole conductor or through-hole conductor as the through conductor. Also, the second power wiring conductor P2, the second ground wiring conductor G2 and, as specifications demand, the first signal wiring conductor S1 are formed.

Furthermore, a polyimide film is applied on the second insulating layer I2 and the respective wiring conductors by spin coating, and curing process, so that the third insulating layer I3 is formed so as to have a thickness of 5 μm to 20 μm. Then, the via hole or through hole for connecting the respective wiring conductors formed on this third insulating layer I3 to the respective wiring conductors formed downward is formed by photolithography.

Accordingly, the respective insulating layers and wiring conductors are formed. In this case, when the respective wiring conductors on the first and second insulating layers I1 and I2 are placed in the X direction, the respective wiring conductors on the third and fourth insulating layers I3 and I4 must be placed in the Y direction.

In addition, all the first to fourth power wiring conductors P1 to P4 are electrically connected to each other in groups of two via the through conductors used for connecting and disposed on the insulating layers.

In the same manner, the first to fourth ground wiring conductors G1 to G4 are electrically connected to each other in groups of two via the through conductors disposed on the insulating layers Further, the first and second signal wiring conductors S1 and S2 are electrically connected to each other via the through conductors disposed on the insulating layers when it is required to connect them as wiring conductors of the X and Y directions.

Accordingly, the respective insulating layers, the respective wiring conductors and the through conductors are sequentially formed and overlaid, so that the multilayer circuit board can be realized.

Figure 5A:
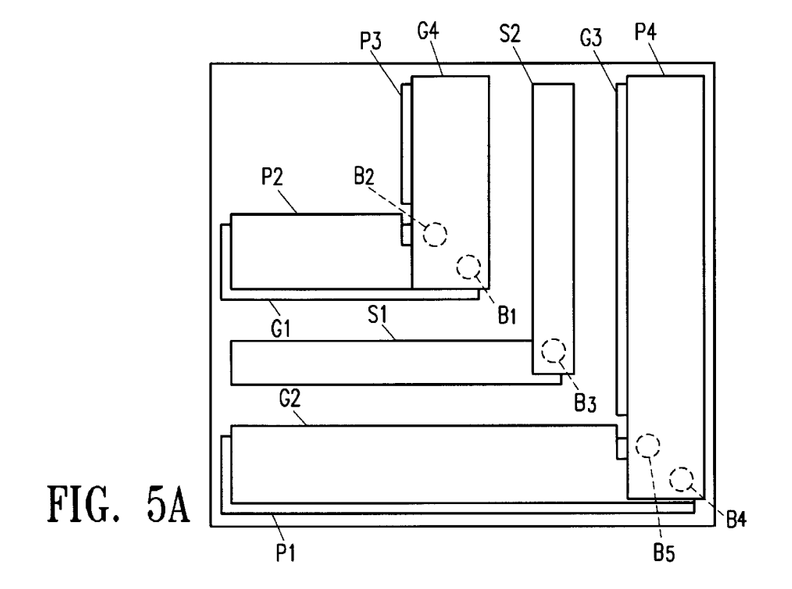
FIG. 5A is a plan view and FIGS. 5B and 5C are section views of a fifth embodiment of the multilayer circuit board according to the invention.
Figure 5B:
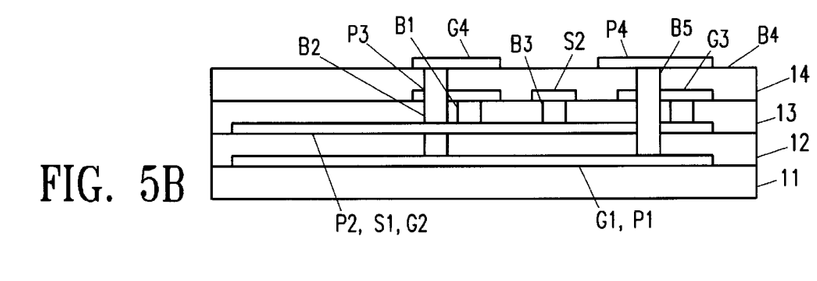
Figure 5C:
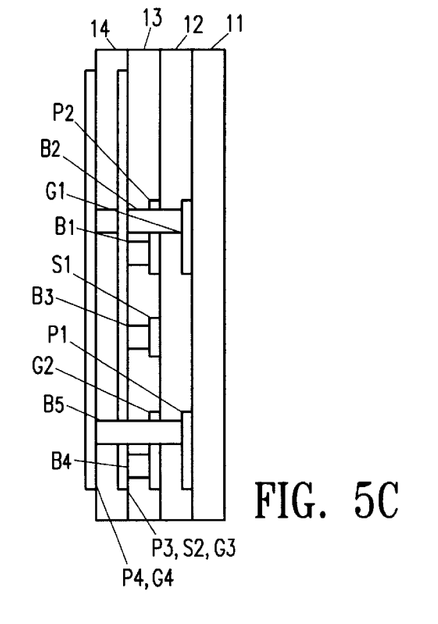

FIG. 5A is a plan view and FIGS. 5B and 5C are section views of a fifth embodiment of the multilayer circuit board according to the invention, and each of FIGS. 5A to 5C is drawn in the same manner as FIGS. 1 to 4. The fifth embodiment is characterized in that via-hole conductors B1 to B5 are used as the through conductors in place of the through-hole conductors T1 to T5, wherein connecting portions of the power wiring conductors P1 to P4 and the ground wiring conductors G1 to G4, which are used for connecting each other by the via-hole conductors B1 to B5, are not provided either inside or outside right angles formed by the wiring conductors, but are held within the width of the wiring conductors by preparing proper notches at the ends, so that uniformity of the characteristic impedance is maintained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multilayer circuit board comprising:
   a first insulating layer, on a top of which a first power wiring conductor and a first ground wiring conductor are arranged substantially parallel to each other;
   a second insulating layer, on a top of which a second power wiring conductor, a second ground wiring conductor and a first signal wiring conductor between the second power wiring conductor and the second ground wiring conductor are arranged substantially parallel to each other;
   a third insulating layer, on a top of which a third power wiring conductor, a third ground wiring conductor and a second signal wiring conductor between the third power wiring conductor and the third ground wiring conductor are arranged substantially parallel to each other; and
   a fourth insulating layer, on a top of which a fourth power wiring conductor and a fourth ground wiring conductor are
   arranged substantially parallel to each other, the first to fourth insulating layers being sequentially overlaid in such a manner that:
      the first power wiring conductor and the second ground wiring conductor, as well as the first ground wiring conductor and the second power wiring conductor are opposed to each other nearly in parallel via the second insulating layer interposed therebetween;
      the third power wiring conductor and the fourth ground wiring conductor, as well as the third ground wiring conductor and the fourth power wiring conductor are opposed to each other nearly in parallel via the fourth insulating layer interposed therebetween; and
      each wiring on the first insulating layer and the second insulating layer intersects with each wiring on the third insulating layer and the fourth insulating layer at almost right angles,
   wherein the first to fourth power wiring conductors and the first to fourth ground wiring conductors are connected to each other via through conductors passing through the insulating layers.

2. A multilayer circuit board comprising:
   a first insulating layer, on a top of which a first power wiring conductor, a first ground wiring conductor and a first signal wiring conductor between the first power wiring conductor and the first ground wiring conductor are arranged substantially parallel to each other;

a second insulating layer, on a top of which a second power wiring conductor and a second ground wiring conductor are arranged substantially parallel to each other;

a third insulating layer, on a top of which a third power wiring conductor, a third ground wiring conductor and a second signal wiring conductor between the third power wiring conductor and the third ground wiring conductor are arranged substantially parallel to each other; and a fourth insulating layer, on a top of which a fourth power wiring conductor and a fourth ground wiring conductor are arranged substantially parallel to each other, the first to fourth insulating layers being sequentially overlaid in such a manner that;

the first power wiring conductor and the second ground wiring conductor, as well as the first ground wiring conductor and the second power wiring conductor are opposed to each other nearly in parallel via the second insulating layer interposed therebetween;

the third power wiring conductor and the fourth ground wiring conductor, as well as the third ground wiring conductor and the fourth power wiring conductor are opposed to each other nearly in parallel via the fourth insulating layer interposed therebetween; and each wiring on the first insulating layer and the second insulating layer intersects with each wiring on the third insulating layer and the fourth insulating layer at almost right angles, wherein the first to fourth power wiring conductors and the first to fourth ground wiring conductors are connected to each other via through conductors passing through the insulating layers.

3. A multilayer circuit board comprising:

a first insulating layer, on a top of which a first power wiring conductor, a first ground wiring conductor and a first signal wiring conductor between the first power wiring conductor and the first ground wiring conductor are arranged substantially parallel to each other;

a second insulating layer, on a top of which a second power wiring conductor and a second ground wiring conductor are arranged substantially parallel to each other;

a third insulating layer, on a top of which a third power wiring conductor and a third ground wiring conductor are arranged substantially parallel to each other; and a fourth insulating layer, on a top of which a fourth power wiring conductor, a fourth ground wiring conductor and a second signal wiring conductor between the fourth power wiring conductor and the fourth ground wiring conductor are arranged substantially parallel to each other, the first to fourth insulating layers being sequentially overlaid in such a manner that:

the first power wiring conductor and the second ground wiring conductor, as well as the first ground wiring conductor and the second power wiring conductor are opposed to each other nearly in parallel via the second insulating layer interposed therebetween;

the third power wiring conductor and the fourth ground wiring conductor, as well as the third ground wiring conductor and the fourth power wiring conductor are opposed to each other nearly in parallel via the fourth insulating layer interposed therebetween; and each wiring on the first insulating layer and the second insulating layer intersects with each wiring on the third insulating layer and the fourth insulating layer at almost right angles, wherein the first to fourth power wiring conductors and the first to fourth ground wiring conductors are connected to each other via through conductors passing through the insulating layers.

4. A multilayer circuit board comprising:

a first insulating layer, on a top of which a first power wiring conductor and a first ground wiring conductor are arranged substantially parallel to each other;

a second insulating layer, on a top of which a second power wiring conductor, a second ground wiring conductor and a first signal wiring conductor between the second power wiring conductor and the second ground wiring conductor are arranged substantially parallel to each other;

a third insulating layer, on a top of which a third power wiring conductor and a third ground wiring conductor are arranged substantially parallel to each other; and a fourth insulating layer, on a top of which a fourth power wiring conductor, a fourth ground wiring conductor and a second signal wiring conductor between the fourth power wiring conductor and the fourth ground wiring conductor are arranged substantially parallel to each other, the first to fourth insulating layers being sequentially overlaid in such a manner that:

the first power wiring conductor and the second ground wiring conductor, as well as the first ground wiring conductor and the second power wiring conductor are opposed to each other nearly in parallel via the second insulating layer interposed therebetween;

the third power wiring conductor and the fourth ground wiring conductor, as well as the third ground wiring conductor and the fourth power wiring conductor are opposed to each other nearly in parallel via the fourth insulating layer interposed therebetween; and each wiring on the first insulating layer and the second insulating layer intersects with each wiring on the third insulating layer and the fourth insulating layer at almost right angles, wherein the first to fourth power wiring conductors and the first to fourth ground wiring conductors are connected to each other via through conductors passing through the insulating layers.

5. The multilayer circuit board of any one of claims 1 to 4, wherein the first to fourth insulating layers are formed of an insulating resin having a relative dielectric constant of 2 to 5.

6. The multilayer circuit board of claim 5, wherein the first to fourth insulating layers are formed of the insulating resin selected from the group of fluororesins, polynorbornene resins, benzocyclobutene resins, polyimide resins and epoxy resins.

7. The multilayer circuit board of any one of claims 1 to 4, wherein the first insulating layer has a thickness of 3 $\mu$m to 20 $\mu$m, the third insulating layers has a thickness of 0.5 $\mu$m to 20 $\mu$m, and the second and fourth insulating layers have a thickness of 0.5 $\mu$m to 3 $\mu$m.

8. The multilayer circuit board of any one of claims 1 to 4, wherein each of the first to fourth power wiring conductors, the first to fourth ground wiring conductors and the first and second signal wiring conductors has a main conductive metal layer formed of copper, gold or silver.

9. The multilayer circuit board of claim 8, wherein the main conductive metal layer has a thickness of 1 μm to 10 μm.

10. The multilayer circuit board of claim 8, wherein each of the first to fourth power wiring conductors, first to fourth ground wiring conductors and first and second signal wiring conductors has the main conductive layer and an adhesion metal layer formed of chromium, titanium, molybdenum or niobium.

11. The multilayer circuit board of claim 10, wherein the adhesion metal layer has a thickness of 0.03 μm to 0.2 μm.

* * * * *